United States Patent
Szajnowski

(10) Patent No.: US 8,223,064 B2
(45) Date of Patent: Jul. 17, 2012

(54) SPECTRAL ANALYSIS AND FMCW AUTOMOTIVE RADAR UTILIZING THE SAME

(75) Inventor: Wieslaw Jerzy Szajnowski, Guildford (GB)

(73) Assignee: Mitsubishi Electric Corporation, Tokyo (JP)

( * ) Notice: Subject to any disclaimer, the term of this patent is extended or adjusted under 35 U.S.C. 154(b) by 322 days.

(21) Appl. No.: 12/716,046

(22) Filed: Mar. 2, 2010

(65) Prior Publication Data
US 2010/0225524 A1 Sep. 9, 2010

(30) Foreign Application Priority Data

Mar. 3, 2009 (EP) .................................... 09154245

(51) Int. Cl.
*G01S 13/00* (2006.01)
(52) U.S. Cl. ........................ 342/70; 342/159; 342/196
(58) Field of Classification Search .................... 342/70, 342/159, 196
See application file for complete search history.

(56) References Cited

U.S. PATENT DOCUMENTS

| | | | |
|---|---|---|---|
| 5,301,123 A | 4/1994 | Kay | |
| 6,539,320 B1 | 3/2003 | Szajnowski et al. | |
| 7,120,555 B2 | 10/2006 | Szajnowski | |
| 7,216,047 B2 | 5/2007 | Szajnowski | |
| 2005/0033537 A1* | 2/2005 | Szajnowski | 702/79 |

FOREIGN PATENT DOCUMENTS

| | | |
|---|---|---|
| EP | 1378854 A1 | 1/2004 |
| EP | 1498410 A1 | 1/2005 |
| EP | 1777549 A1 | 4/2007 |
| EP | 2000810 A1 | 12/2008 |
| WO | 2008/149100 A1 | 12/2008 |

OTHER PUBLICATIONS

Graham M. Brooker, "Mutual Interference of Millimeter-Wave Radar Systems", IEEE Transactions on Electromagnetic Compatibility, vol. 49, No. 1, Feb. 2007, pp. 170-181.
Szajnowski et al., "Implicit Averaging and Delay Determination of Random Binary Waveforms", IEEE Signal Processing Letters, IEEE USA, vol. 9, No. 7, Jul. 2002, pp. 193-195 XP002541387.

* cited by examiner

*Primary Examiner* — Timothy A Brainard
(74) *Attorney, Agent, or Firm* — Birch, Stewart, Kolasch & Birch, LLP

(57) ABSTRACT

A method of processing an input signal to perform frequency analysis is disclosed. The input signal comprises a desired signal and an interference signal. A crosslation is performed to generate a representation of the frequency content of the input signal. The representation comprises initial crosslation values predominantly corresponding to interference and subsequent crosslation values corresponding to the desired signal. For the crosslation values corresponding to interference, a maximum value and slope are calculated. These are used as parameter indicators of the interference and also to identify which values should be discarded in the processing of the desired signal. With the crosslation values corresponding to interference discarded, the remaining crosslation values are processed to calculate properties of the desired signal.

17 Claims, 8 Drawing Sheets a)

b)

SPECTRAL ANALYSIS AND FMCW AUTOMOTIVE RADAR UTILIZING THE SAME

CROSS-REFERENCE TO RELATED APPLICATION

This application claims the right of priority based on EPC patent application number 09 154 245.6 dated 3 Mar. 2009, which is hereby incorporated by reference herein in its entirety as if fully set forth herein.

FIELD OF THE INVENTION

This invention relates to a method and apparatus intended for spectral analysis of a waveform corrupted by noise and also other interference of transient or impulsive nature. The disclosed method is particularly, but not exclusively, applicable to the analysis of 'beat-frequency' signals used in a frequency-modulated continuous-wave (FMCW) automotive radar for determining the range and radial velocity of an object of interest.

BACKGROUND OF THE INVENTION

Physical phenomena of interest in science and engineering are usually observed and interpreted in terms of amplitude-versus-time functions, referred to as signals or waveforms. The instantaneous value of the function, the amplitude, may represent some physical quantity of interest (an observable), such as displacement, velocity, pressure, temperature etc. The argument of the function, the time, may represent any appropriate independent variable, such as relative time, distance, spatial location, angular position etc.

Many physical phenomena are of non-deterministic nature, i.e. each experiment produces a unique time series which is not likely to be repeated exactly and thus cannot be accurately predicted. An important class of time series, stationary time series, exhibit statistical properties which are invariant throughout time, so that the statistical behaviour during one epoch is the same as it would be during any other.

There are two distinct, yet broadly equivalent, approaches to time series representation and analysis: the time-domain methods and the frequency-domain (or spectral) methods. Conventional non-parametric frequency-domain methods are either based on the concept of 'periodogram' or they employ some form of Fourier transform to convert correlation functions into power spectra.

Although many waveforms encountered in practical applications are clearly non-stationary, most spectral analysis techniques are based on the implicit assumption that waveforms of interest are stationary. Therefore, conventional spectral methods are not well suited to examining signals corrupted by interference of impulsive or transient nature encountered in industrial and/or multiuser applications.

As will be described in further detail below, an application in which robust real-time spectral analysis is useful is that of determining the range and velocity of an object in automotive FMCW radar operating in a multiuser environment.

FIG. 1 is a simplified functional block diagram of conventional FMCW automotive radar. The system comprises a triangular waveform generator WFG, a voltage-controlled oscillator VCO, acting also as an up-converter, a coupler CPL, a circulator CIR to provide a single-antenna operation, a transmit-receive antenna TRA, a mixer MXR, a low-pass filter/amplifier LPA, and a digital signal processor DSP.

The triangular waveform generator WFG supplies a control signal CV to make the voltage-controlled oscillator VCO produce frequency up-sweeps and down-sweeps. A resulting waveform TW transmitted by the antenna TRA has a constant amplitude but its frequency sweeps the band $\Delta f$ during each up-sweep or down-sweep time interval $T_S$.

The echo RW from an obstacle OBS at range L will be an attenuated copy of the transmitted waveform TW, delayed in time by $(2L/c)$, where c is the speed of light. The echo RW is mixed in the mixer MXR with a portion of the transmitted waveform TW supplied by the coupler CPL. The output signal QS of the mixer MXR is amplified and filtered in the low-pass filter/amplifier LPA to produce a beat signal BF whose frequency ft, is directly proportional to obstacle range $$f_L = \frac{2L\Delta f}{cT_s}$$

where $\Delta f$ and Ts are the frequency sweep band and sweep time, respectively, as described previously.

Additionally, a relative radial movement with velocity V between the radar and an object of interest will superimpose on the beat frequency $f_L$ a Doppler frequency shift $$f_V = \frac{2Vf_c}{c}$$

where $f_C$ is the radar carrier frequency. Usually, the carrier frequency $f_C$ is much greater than the band $\Delta f$ of the frequency sweep; hence, in practice, the Doppler shift $f_V$ is not affected by frequency modulation.

Therefore, a distant moving object gives rise to a beat signal having a beat frequency $$f_E = f_L \mp f_V$$

where the sign associated with the Doppler shift is positive for approaching objects.

The digital signal processor DSP combines up-sweep and down-sweep beat frequencies to determine both the range L and the relative velocity V of an obstacle. Estimated values of range L and velocity V are produced at output LV of the processor DSP. For correct operation, the signal processor DSP receives from the waveform generator WFG a synchronizing pulse SP indicative of the beginning and direction of each frequency sweep.

An analysis presented in: Graham M. Brooker, *Mutual Interference of Millimeter-Wave Radar Systems* (IEEE Transactions on Electromagnetic Compatibility, EC-49, February 2007, pp. 170-181) has concluded that the common modulation schemes used in automotive radar are susceptible to multiuser interference. Although some forms of interference can be suppressed, there are others which are impossible to control, resulting in inferior obstacle detection and unreliable estimation of its range and velocity. Therefore, it appears that until the problem of resistance to multiuser interference has been solved, automotive radar cannot become a commercial success.

In the above and other applications, a signal of interest comprises a dominant-frequency waveform combined with noise and multiuser interference of transient nature. A standard approach exploited in automotive FMCW radars is based on applying some form of Fourier transform (usually FFT) directly to an observed signal. However, the presence of multiuser interference will increase the level of background noise in the frequency domain, thus significantly complicating the task of detecting a small frequency component in the resulting noise. Therefore, any spectral analysis method to be of practical use should incorporate some measures of efficient interference rejection/suppression.

SUMMARY OF THE INVENTION

According to the present invention, there is provided a frequency analyser, comprising:
a crosslator operable to process an input signal containing a desired signal and interference to produce a sequence of discrete-time crosslation function values for the input signal;
a peak detector operable to detect a first peak in the sequence of crosslation function values;
a slope detector operable to detect a slope of a line through the origin and the first value in the sequence of crosslation function values;
a selector operable to select a subset of the crosslation function values based upon the detected first peak and the detected slope; and
a frequency calculator operable to process the subset of crosslation function values, to calculate a frequency value of the desired signal.

The present invention also provides a frequency-modulated continuous-wave radar system comprising:
a radar signal generator operable to generate and transmit a frequency-modulated continuous-wave radar signal;
a receiver for receiving a reflected radar signal;
a beat signal generator for generating a beat signal from the generated and received radar signals; and
a frequency analyzer as set out above that is arranged to receive the beat signal as its input signal and calculate the frequency of the beat signal.

The present invention further provides the frequency analysis method performed by the frequency analyser above and the method performed by the frequency-modulated continuous-wave radar system above.

UNDERLYING THEORY

Figure 1:
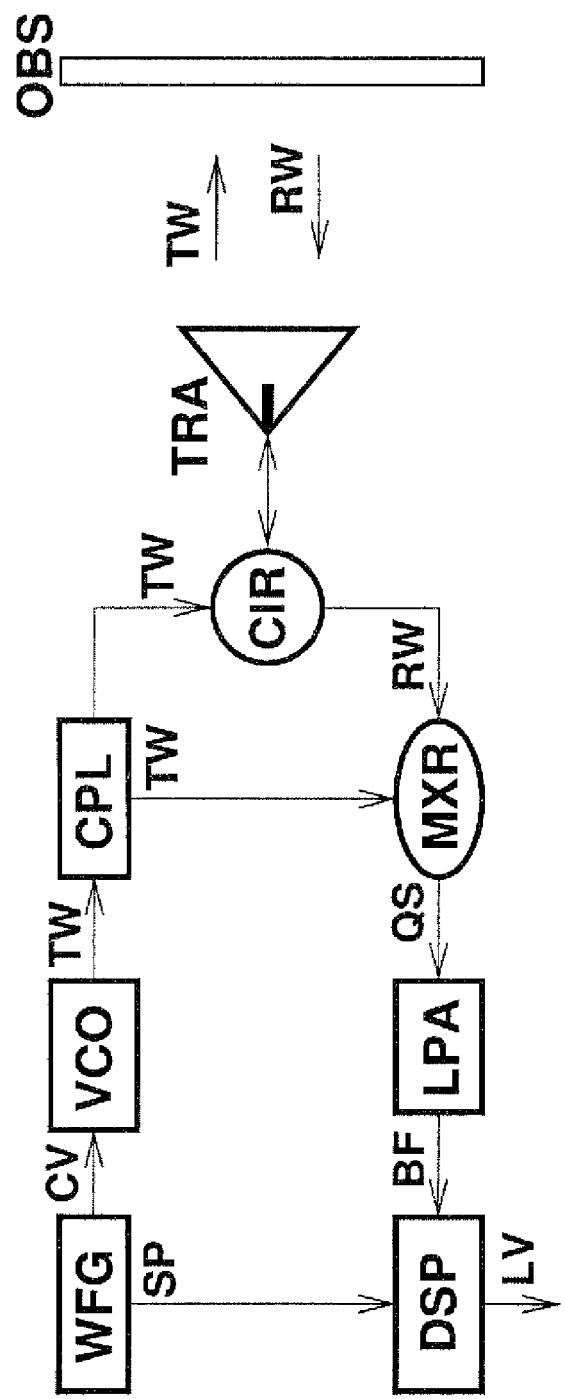
FIG. 1 is a simplified functional block diagram of conventional FMCW automotive radar.

Before describing embodiments of the present invention, the theory underlying the operation of the embodiments will be described first to assist understanding.

The embodiments make use of a technique known as crosslation. This technique has been disclosed for time-domain processing in a number of patents; see, for example, U.S. Pat. No. 7,120,555, U.S. Pat. No. 6,539,320 and U.S. Pat. No. 7,216,047.

A brief summary of the crosslation technique is given below for reference purposes, in order to facilitate the understanding of its specific characteristics that are relevant to embodiments of the present invention.

In accordance with the crosslation algorithm, a signal $s(t)$ of interest is examined to determine the time instants at which its level crosses zero, either with a positive slope (an upcrossing) or with a negative slope (a downcrossing). The time instants of these crossing events are used to obtain respective segments of the signal $s(t)$, the segments having a predetermined duration. The segments corresponding to zero upcrossings are all summed, and the segments corresponding to zero downcrossings are all subtracted from the resulting sum. The combined segments are represented by an odd function, referred to as the crosslation function that contains compressed information regarding the statistical characteristics of the signal being analyzed.

To explain crosslation further, consider a continuous zero-mean signal $s(t)$; there are time instants at which the signal crosses a zero level with a positive or negative slope. These time instants $$t_1, t_2, \ldots, t_k, \ldots, t_K$$

will form a set of zero upcrossings and downcrossings. Suppose that any one of the zero crossings of $s(t)$, say that at $t_k$, has been selected. Consider now the primary signal $s(t)$ before and after its zero crossing, $s(t_k)=0$, occurring at this selected time instant $t_k$.

For the purpose of this analysis, it is convenient to introduce the notion of signal trajectory, associated with a zero crossing of the signal. For a zero crossing occurring at $t_k$, the signal trajectory $s_k(\tau)$ is determined from $$s_k(\tau)=s(t_k+\tau); k=1, 2, \ldots K$$

where $\tau$ is (positive or negative) relative time. Accordingly, each trajectory $s_k(\tau)$ is simply a time-shifted copy of the primary signal $s(t)$. The time shift, different for each trajectory, results from the time transformation $$\tau=t-t_k; k=1, 2, \ldots K,$$

used for transporting signal trajectories from the time domain (t) to the tau-domain ($\tau$).

Accordingly, a single primary signal $s(t)$ can generate successively a plurality of trajectories $\{s(t_k+\tau); k=1, 2, \ldots K\}$ that are mapped (by the time shifts) into another set of trajectories $\{s_k(\tau); k=1, 2, \ldots K\}$, each being a function of relative time $\tau$ in the tau-domain. Such construction makes all zero crossings of a primary signal $s(t)$ equivalent in the sense that they, being aligned in time, jointly define the same origin $\tau=0$ of the relative time $\tau$.

The duration of each trajectory used for further signal processing is determined by a preselected trajectory frame. In addition, within this frame, a specific location is selected (e.g., somewhere close to the middle) to become the origin of the relative time $\tau$.

Figure 3:
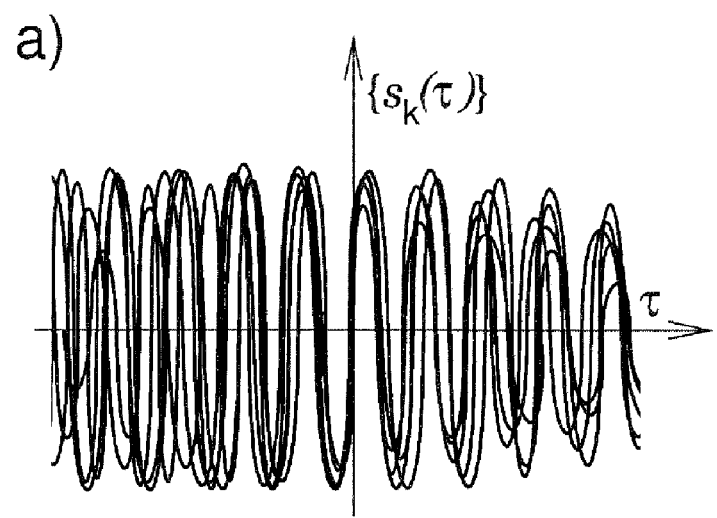
FIG. 3a is an overlay of segments of a signal processed in a prior-art crosslator system.
FIG. 3b depicts the crosslation function $C(\tau)$ representing the signal being processed.
Figure 3:
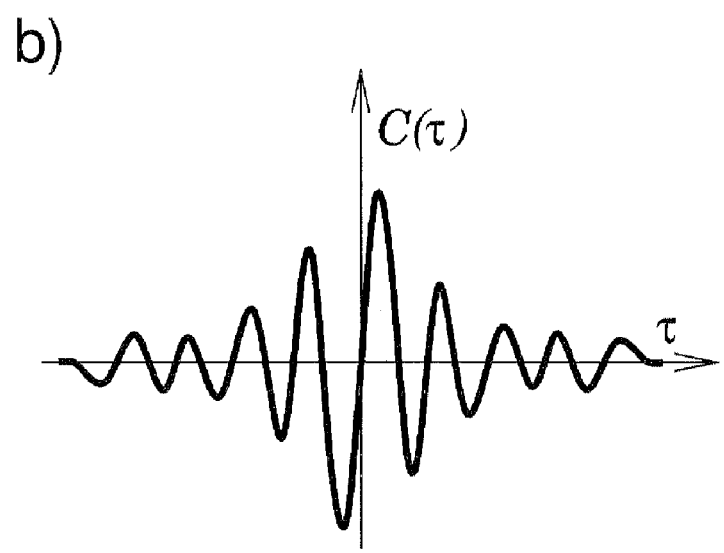

When the above time-shifting procedure has been replicated for each of the selected K zero crossings, the trajectory frame in the tau-domain will have contained K signal trajectories, and the positions of the corresponding zero crossings will have coincided with the relative time origin, $\tau=0$. For illustrative purposes, FIG. 3a depicts an overlay of time-aligned signal trajectories associated with zero upcrossings.

K signal trajectories $\{s(t_k+\tau), k=1, 2, \ldots, K\}$, associated with zero crossings $\{s(t_k)=0\}$ of a primary signal s(t), are used to determine a crosslation function $C(\tau)$, defined by $$C(\tau) = \frac{1}{K}\sum_{k=1}^{K} (-1)^\psi s(t - t_k) = \frac{1}{K}\sum_{k=1}^{K} (-1)^\psi s_k(\tau)$$

where $\psi=0$ for a zero upcrossing, and $\psi=1$ for a zero downcrossing. Accordingly, each signal trajectory associated with a zero upcrossing is being added to the resulting sum, whereas a trajectory associated with a zero downcrossing is being subtracted from that sum.

The crosslation function $C(\tau)$ will always attain a zero value at $\tau=0$; however, other zero values may be observed at other non-zero values of the relative time $\tau$. FIG. 3b is an example of a crosslation function obtained by averaging a number of signal trajectories suitably aligned in the tau-domain.

It should be pointed out that in the case of processing signals with stationary properties it is not necessary to use all consecutive zero crossings to determine a crosslation function. For example, when a relatively long record of a stationary random signal is available, it is possible to select zero crossings separated by at least some predetermined time interval.

Note that in the context of crosslation-based spectral analysis, the relative time $\tau$ has a meaning of elapsed time, since each trajectory starts at an actually observed "now" time instant and goes back in (real) time, so that only accumulated "past experience" is exploited for inference regarding a signal under examination.

Figure 2:
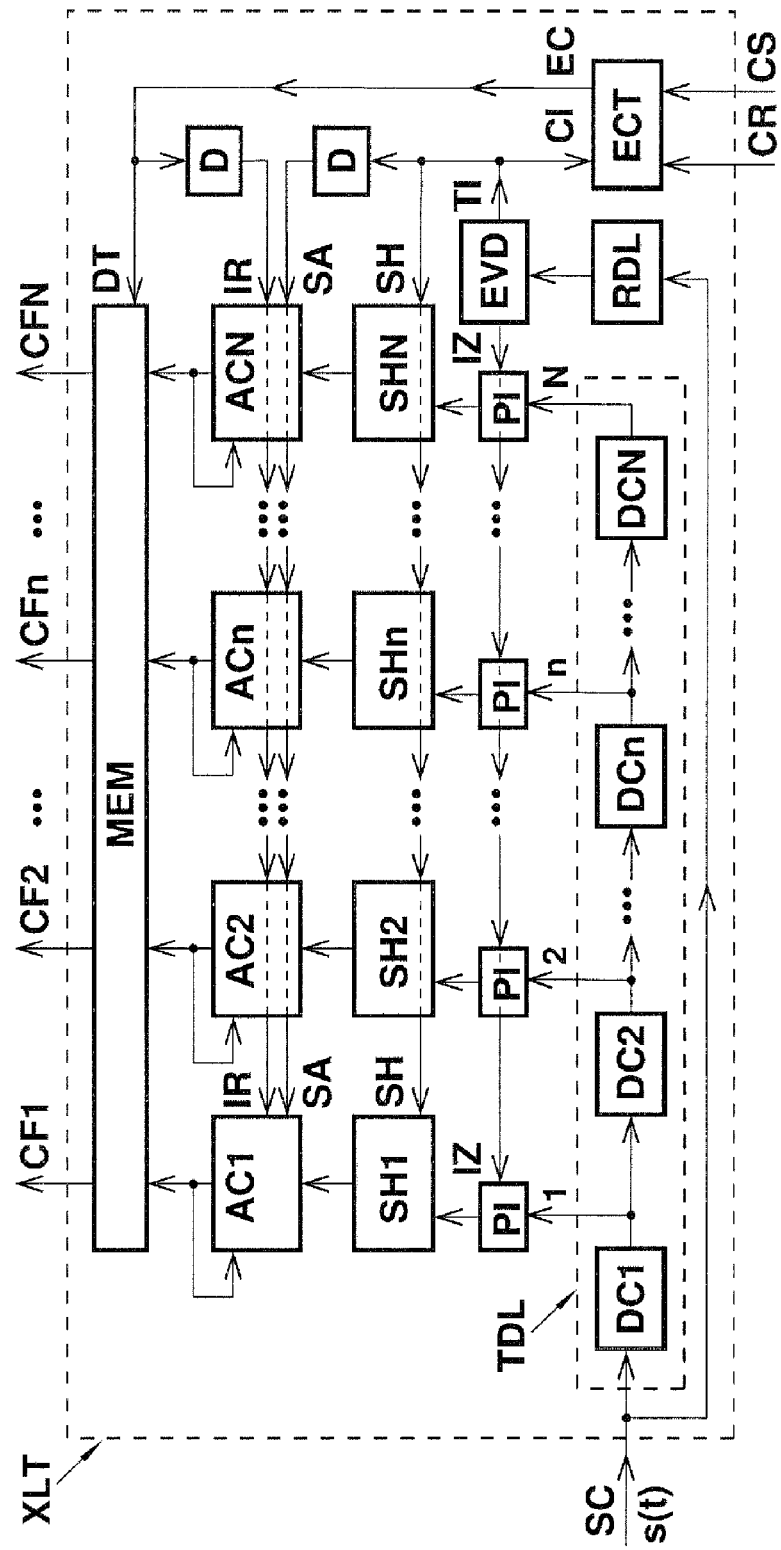
FIG. 2 is a functional block diagram of a prior-art crosslator system.

A functional block diagram of a crosslator system XLT is shown in FIG. 2. The system comprises a cascade of N delay cells, DC1, . . . , DCn, . . . , DCN, forming a tapped delay line TDL, an array of identical polarity-reversal circuits PI, a plurality of sample-and-hold circuits, SH1, . . . , SHn, . . . , SHN, a plurality of accumulators AC1, . . . , ACn, . . . , ACN, a memory MEM, a constant delay line RDL, an event detector EVD, an event counter ECT, and two auxiliary delay units D.

Each of N taps of the delay line TDL provides a time-delayed replica of the analyzed signal s(t) applied to input SC. At any time instant, the values observed at the N taps of the line TDL form jointly a representation of a finite segment of the input signal s(t) propagating along the line TDL. Preferably, the relative delay between consecutive taps of the TDL has a constant value.

In a parallel signal path, the input signal s(t) is delayed in the constant delay line RDL by a time amount equal approximately to a half of the total delay introduced by the tapped delay line TDL. The output of the delay line RDL drives the event detector EVD.

When the event detector EVD detects a zero crossing in the delayed signal s(t), a short trigger pulse TI is produced at output TI, and output IZ supplies a signal indicating the type (up or down) of a detected zero crossing.

Each circuit PI of the array of identical polarity-reversal circuits is driven by a respective tap of the delay line TDL and it supplies a signal to a corresponding sample-and-hold circuit. In response to a signal at control input IZ, each circuit PI either passes its input signal with a reversed polarity (when a zero downcrossing is detected), or passes its input signal in its original form (when a zero upcrossing is detected).

A short trigger pulse TI is generated by the event detector EVD to initiate, via the common input SH, a simultaneous operation of all sample-and-hold circuits, SH1, . . . , SHn, . . . , SHN. Each sample-and-hold circuit SHn captures the instantaneous value of the signal appearing at its input; this value is then acquired by a respective accumulator ACn at the time instant determined by a delayed trigger pulse TI applied to the common input SA. The trigger pulse TI also increments by one via input CI the current state of an event counter ECT.

The capacity of the event counter ECT is equal to a predetermined number of zero crossings to be detected in the input signal s(t). Accordingly, the time interval needed to detect the predetermined number of zero crossings will determine the duration of one complete cycle of operation of the crosslator system.

The capacity of the event counter ECT can be set to a required value by applying a suitable external control signal to input CS. Additionally, the state of the event counter ECT can be reset, via input CR, to an initial 'zero state'; this 'zero sate' will also reset to zero all the accumulators. The event counter ECT can as well be arranged to operate continually in a 'free-running' fashion.

A trigger pulse TI delayed in the delay unit D initiates, via common input SA, the simultaneous operation of all accumulators driven by respective sample-and-hold circuits. The function of each accumulator ACn is to perform addition of signal values appearing successively at its input during each full operation cycle of the crosslator system. As explained below, all the accumulators are reset to zero, via common input a, before the start of each new cycle of operation.

When a predetermined number of zero crossings has been detected by the event detector EVD, and registered by the event counter ECT, an end-of-cycle pulse EC is produced at the output of the counter ECT. This pulse initiates, via input DT, the transfer of the accumulators' data to the memory MEM. As a result, a discrete-time version of the determined crosslation function $C(\tau)$ will appear at the N outputs, CF1, . . . , CFn, . . . , CFN of the memory MEM.

An end-of-cycle pulse EC, suitably delayed in the delay unit D, is used to reset to zero, via common input IR, all the accumulators. Also, when operating in a 'free-running' mode, the event counter ECT after reaching its maximum value (capacity) will revert to its initial 'zero state'. At this stage, the crosslator system XLT, having completed its full cycle of operation, is ready to start a new cycle. It should be pointed out that the operation of the crosslator XLT can be terminated and re-started at any time by applying a suitable control signal to input CR of the event counter ECT.

FIG. 3a is an example of an overlay of time-aligned segments $\{s_k(\tau)\}$ of a fluctuating signal s(t) comprising a dominant-frequency component; FIG. 3b depicts the resulting crosslation function $C(\tau)$ used to represent the signal being processed.

The crosslation function contains information generally associated with timing, or phase, relationships between different segments of the same signal. However, for the purpose of signal detection and analysis in the frequency domain, it would be advantageous to develop a crosslation-based spectral method that would be capable of suppressing non-stationary interference. Preferably, such method should have sufficiently low computational complexity to be implemented with a low-cost hardware/software.

Embodiments of the present invention provide a crosslation-based method of robust real-time spectral analysis that can be employed in automotive FMCW radar operating in a multiuser environment.

PREFERRED EMBODIMENT

This embodiment is based on the inventor's observation that the crosslation function of a sinewave with an arbitrary initial phase shift is always a sinewave of the same frequency but having initial phase equal to zero.

In FMCW automotive radar, an information-bearing 'beat-frequency' signal can be represented by the following model $$s(t) = A\cos(2\pi f_B t + \theta) + n(t)$$

where $f_B$ denotes the beat frequency, A and $\theta$ are, respectively, an unknown signal amplitude and unknown phase, and n(t) represents wideband noise and other interference, including multiuser interference.

In a multiuser environment, the noise component n(t) will result from a superposition of a large number of responses of a low-pass filter LPA (see FIG. 1) to signals emitted by other automotive radars operating in the same region. Consequently, the power spectrum of the component n(t) will mostly be determined by the frequency characteristic of the low-pass filter, and the amplitude distribution of n(t) will follow a Gaussian model. In practical situations, the level of harmful interference n(t) may be comparable to that of useful beat signals.

FIG. 4a depicts an empirical crosslation function $C_n(\tau)$ of wideband interference occupying a bandwidth of 200 kHz; this function is also shown in expanded time scale in FIG. 4b. As seen, the presence of wideband interference manifests itself in the form of a pronounced sharp peak in the vicinity of the time origin $\tau=0$. The slope of the peak and its value provide a joint measure of the bandwidth of interference and its level.

As will be described in more detail below, a crosslation function of interference alone can be determined by automotive FMCW radar operating in a 'receive-only', or 'listen-only', mode. Such arrangement will facilitate the evaluation of the level of interference injected into the radar by other active users of the same frequency band.

For wideband noise and/or interference, the shape of the crosslation function $C_n(\tau)$ will mainly be determined by frequency characteristics of a low-pass filter following a mixer, such as an arrangement of blocks MXR and LPA of FIG. 1.

For comparison purposes, FIG. 4c depicts an empirical crosslation function $C_s(\tau)$ of a 25-kHz beat-frequency signal corrupted by the same interference. As seen, when crosslation analysis is used, wideband interference affects only an initial fragment of the crosslation function $C_s(\tau)$ of the sum of a signal and interference. Furthermore, the extent of this fragment can be determined either theoretically or from suitable measurements, as described later.

In contrast to a crosslation-based approach, conventional frequency analysis (e.g., via FFT) will result in producing an enhanced and fluctuating 'noise floor' affecting the entire frequency range, including beat frequencies of interest. The ability to shift all wideband interference to a small and well defined fragment of the elapsed-time domain $\tau$ is one of the many advantages offered by crosslation-based techniques.

Figure 4:
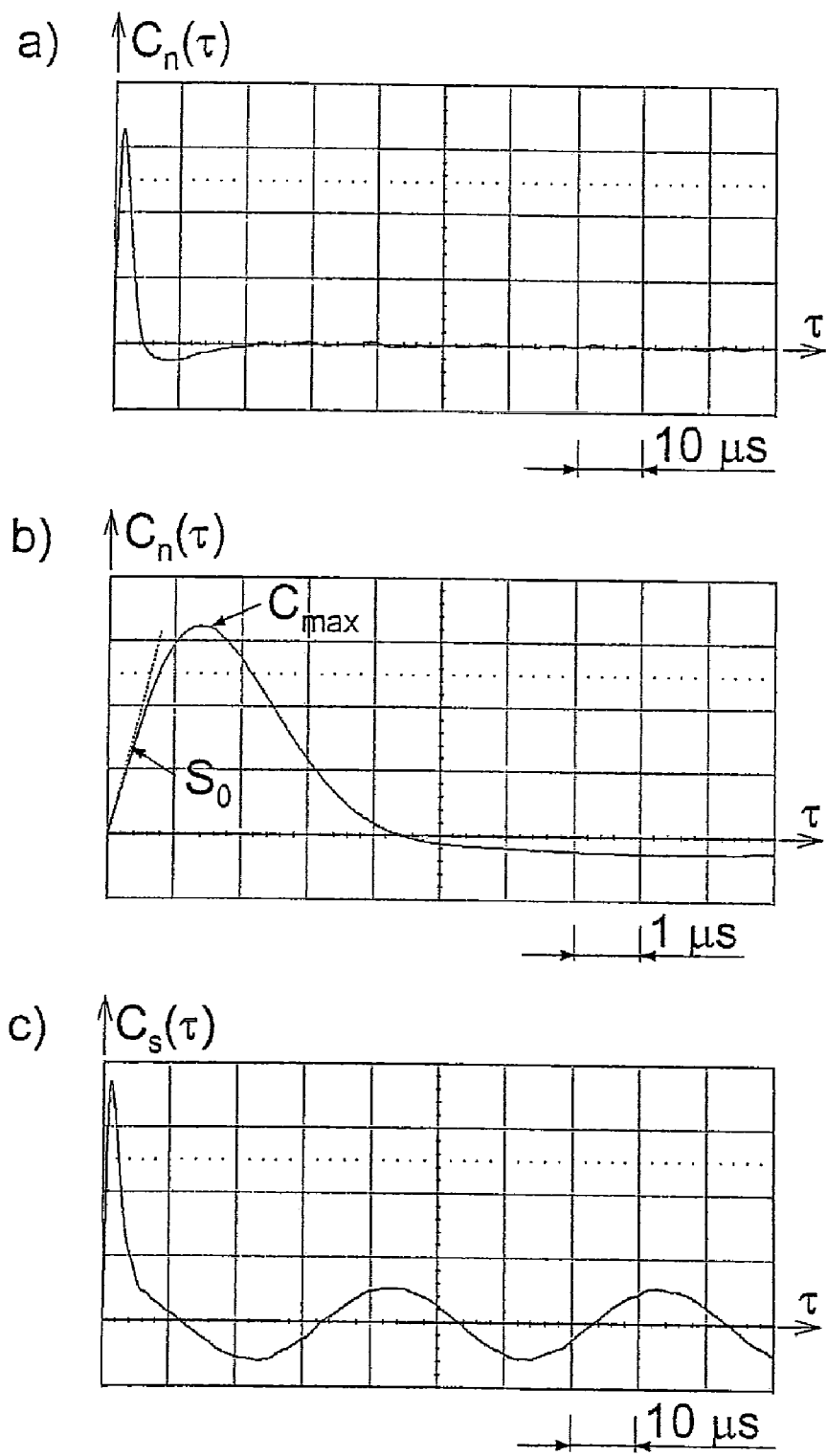
FIG. 4a depicts an empirical crosslation function of wideband interference.
FIG. 4b depicts an empirical crosslation function of wideband interference in expanded time scale.
FIG. 4c depicts an empirical crosslation function of a beat-frequency signal corrupted by wideband interference.

The crosslation functions depicted in FIG. 4 were determined experimentally with the use of a digital storage oscilloscope. For illustrative purposes, a very fine quantization in time was selected so that no quantization effects are visible; also, the time interval used for signal processing was long enough to suppress any statistical amplitude fluctuations in the estimated crosslation functions.

In general, a practical implementation of automotive FMCW radar employs an analogue-to-digital converter that supplies signal samples at regular time intervals determined by a suitable clock generator. Consequently, crosslator system shown in FIG. 2 is not directly applicable to this type of signal format.

Figure 5:
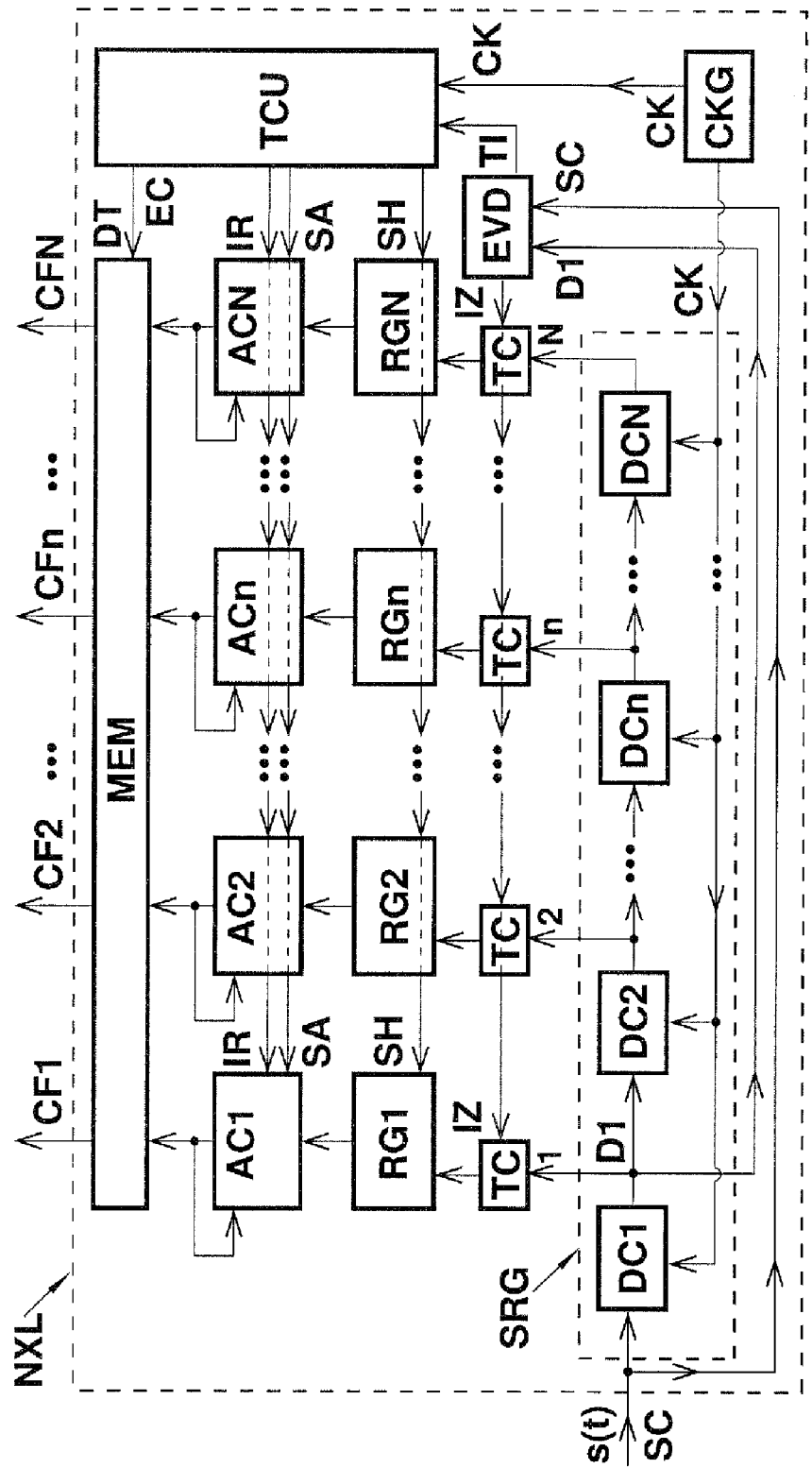
FIG. 5 is an example of a crosslator suitably modified for the processing of discrete-time signals.

FIG. 5 is a block diagram of the crosslator of FIG. 2, suitably modified for the use in applications involving real-time discrete-time signals, or signals represented by a sequence of numbers. The modified system, referred to as 'numeric crosslator' NXL, employs a digital shift register SRG rather than a tapped delay line. Data transfer rate is governed by a clock generator CKG that may also control the operation of a suitable analogue-to-digital converter.

The numeric crosslator NXL of FIG. 5 detects zero crossings in the input signal s(t) as it is evolving continually in real time at input SC. Consequently, the resulting crosslation function $C(\tau)$, being determined in real time t, is a function of elapsed time $\tau$; the origin, $\tau=0$, of which moves perpetually in real time t so that the delay line SRG always contains 'past' signal samples.

In contrast to the arrangement of FIG. 2, in the configuration of FIG. 5, the numeric crosslator NXL processes an input signal s(t) within a predetermined time interval T; therefore, the number of zero crossings observed in an input signal s(t) will vary depending on the signal spectral characteristics. The value of the time interval T is set and monitored by the timing/control unit TCU that receives clock (timing) pulses, via input CK, from clock generator CKG.

In the case of signal samples appearing only at discrete time instants, zero crossings are not observable directly. Instead, the notion of 'virtual zero' crossing is used: an input signal sequence has crossed a 'virtual zero' level when two consecutive signal samples have opposite signs; an upcrossing will be declared if most recent of the two samples is positive.

In the numeric crosslator NXL, the most recent sample is that observed at the input SC, and the previous sample is that observed at the output of cell DC1 of the shift register SRG. Accordingly, those two values are applied to inputs SC and D1 of an event detector EVD.

From statistical considerations, it follows that the time position of a 'virtual zero' crossing is advanced by $\Delta/2$ with respect to output D1 of the shift register SRG, where $\Delta$ is the clock period. Intuitively, 'virtual zero' is each time somewhere 'between' input SC and output D1. The time position of 'virtual zero' crossings is of a practical importance when constructing a practical numeric crosslator system.

In the numeric crosslator NXL of FIG. 5, the polarity of samples can be changed by true/complement circuits TC, and the functions of sample-and-hold circuits are performed now by storage register cells, RG1, ..., RGn, ..., RGN. Other timing and control functions and operations are carried out by a timing/control unit TCU.

Figure 6:
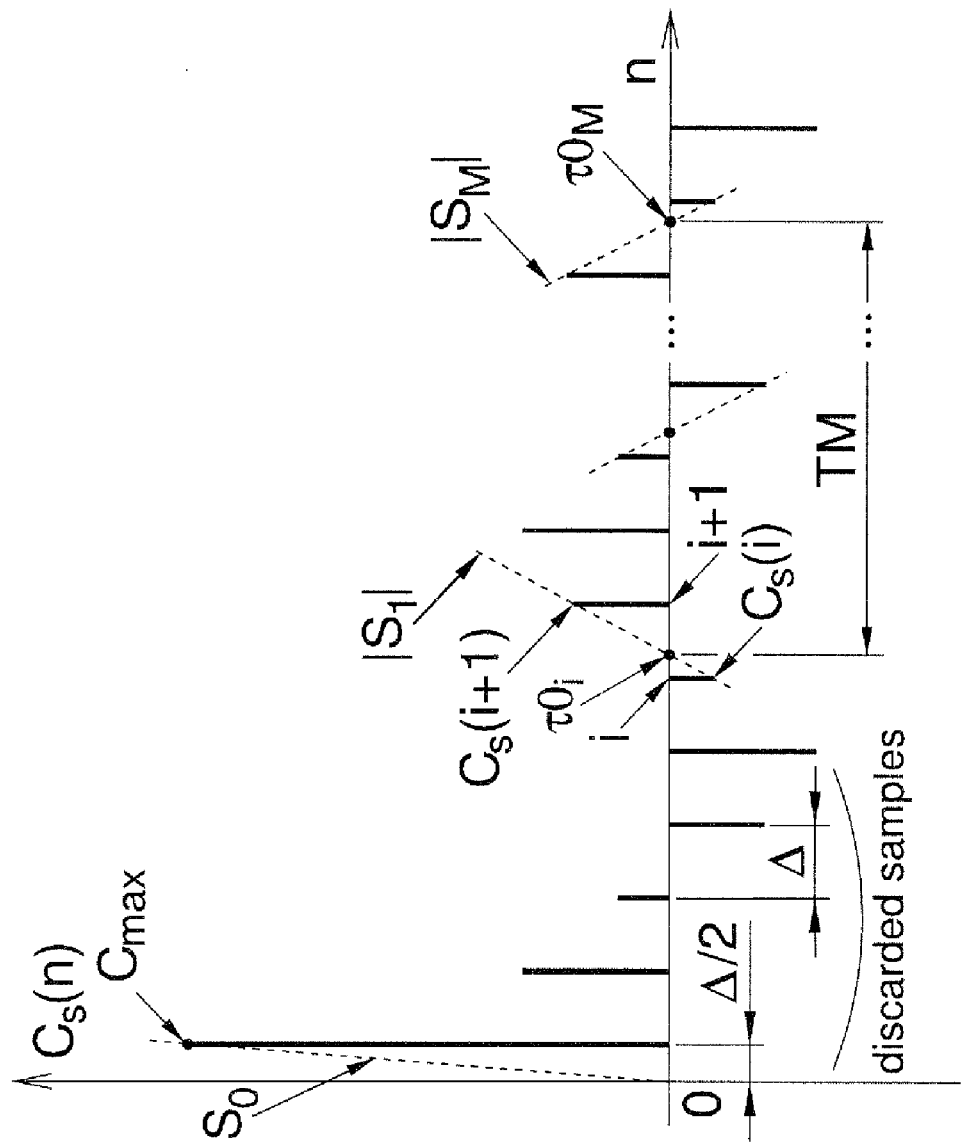
FIG. 6 depicts an example of a crosslation sequence produced by a numeric crosslator constructed in accordance with an embodiment of the invention.

FIG. 6 depicts an example of a crosslation sequence $\{C_s(n)\}$ obtained at the outputs CF1, ..., CFn, ..., CFN, of the numeric crosslator NXL that processes a sinusoidal beat signal corrupted by a high-level wideband interference. The time 'distance' between consecutive crosslation samples is equal to the clock period. However, as shown, a first sample is shifted by $\Delta/2$ with respect to the position of 'virtual zero', denoted by 0.

The slope at zero, $S_0 = 2C_s(1)/\Delta$, and the first peak value $C_{max}$ are indicative of the bandwidth of interference and its level. In FIG. 6 the peak value is attained by a first sample, but the sample having the peak value in practice will depend on the interference bandwidth and the selected clock frequency. In accordance with the present embodiment, the (time) position of this peak and its value are used to disregard a number of crosslation samples appearing close to 'virtual zero' 0. For example, referring to FIG. 4c, a portion of the crosslation function extending from zero to about 10 μs can be eliminated from any subsequent signal processing.

Figure 7:
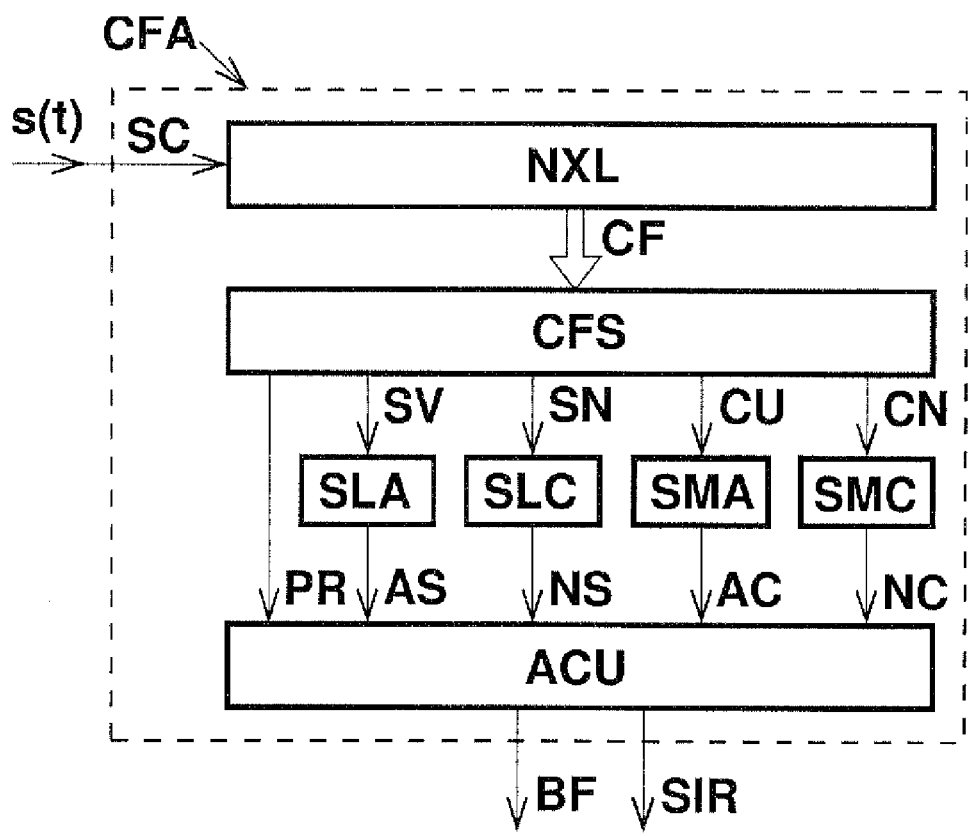
FIG. 7 is a block diagram of a crosslation-based frequency analyzer CFA constructed in accordance with the embodiment of the present invention.

FIG. 7 is a block diagram of a crosslation-based frequency analyzer CFA constructed in accordance with an embodiment of the present invention. The analyzer comprises the following functional blocks:
- a numeric crosslator NXL comprising, for example, the numeric crosslator described above with reference to FIG. 5;
- a crosslation function scanner CFS;
- a slope accumulator SLA;
- a slope counter SLC;
- a magnitude accumulator SMA;
- a sample counter SMC;
- an arithmetic-control unit ACU.

Functions and operations of the crosslation-based frequency analyzer CFA of the third embodiment will now be described with reference to FIG. 6.

In accordance with the embodiment, the crosslation function scanner CFS inspects crosslation samples $$C_s(1), C_s(2), \ldots, C_s(n), \ldots, C_s(N)$$

one by one, starting from sample $C_s(1)$ to determine first the following two parameters:
- the crosslation slope at the origin: $S_0 = 2C_s(1)/\Delta$, where $\Delta$ is the period of the clock generator CKG employed in the numeric crosslator NXL (FIG. 5);
- the first crosslation maximum $C_{max}$.

Those two parameters are used by the crosslation function scanner CFS to determine which crosslation samples should be discarded. The way in which crosslation function scanner CFS determines which crosslation samples to discard will be described later. Also, the two parameters $S_0$ and $C_{max}$ are supplied to the arithmetic-control unit ACU, via input PR, for the calculation of a ratio of signal level to interference level (SIR).

Next, the crosslation function scanner CFS determines the crosslation slope $S(\tau 0_i)$ at each observed zero crossing as follows $$S(\tau 0_i) = |[C_s(i+1) - C_s(i)]|/\Delta$$

The interval $\Delta$ is simply a scaling factor of a constant value, and the measure of each slope is given by an absolute value of the samples, $C_s(i)$ and $C_s(i+1)$, occurring at times i and (i+1), as shown in FIG. 6. The position $\tau 0_i$ of the respective 'virtual zero' is not observable directly; however, it can be determined by applying linear interpolation to two consecutive crosslation samples, $C_s(i)$ and $C_s(i+1)$, such that $C_s(i)C_s(i+1)<0$; i.e. the consecutive samples having opposite signs.

As soon as a crosslation zero has been detected in the interval TM, the crosslation function scanner CFS supplies its value, via input SV, to the slope accumulator SLA. At the same time, the slope counter SLC receives a pulse at input SN. When all crosslation zeros have been processed in the interval TM, the arithmetic/control unit ACU calculates the average slope $S_{ave}$ as the ratio AS/NS.

The crosslation function scanner CFS also transfers, via input CU, to the magnitude accumulator SMA the magnitudes of all crosslation samples occurring within the interval TM between a first used crosslation zero and the last one, as depicted in FIG. 6. Also, the sample counter SMC receives a pulse at input CN each time a magnitude value is sent to the accumulator SMA. When all crosslation samples occurring within the interval TM zeros have been processed, the arithmetic/control unit ACU calculates the average level $H_{ave}$ as the ratio AC/NC.

When the scan is completed, the arithmetic/control unit ACU will have calculated the average slope $S_{ave}$ and the average level $H_{ave}$ for a fragment of a crosslation function representing an integer number of half-cycles of a sinewave. It is easy to show that $$H_{ave} = \frac{2A}{\pi}$$

and $$S_{ave} = 2\pi A f_B$$

where A is unknown amplitude and $f_B$ is an unknown beat frequency of interest. Therefore, the value of the beat frequency is determined by arithmetic/control unit ACU as follows $$f_B = \frac{S_{ave}}{\pi^2 H_{ave}}$$

This value is provided at output BF of the ACU.

The mean slope and the mean level are each calculated as the average of all the respective observables; alternatively, a mean quantity can be determined as the median value of all the respective observables.

The arithmetic/control unit ACU also provides a measure of the signal-to-interference ratio SIR. The value of SIR is proportional to the mean level $H_{ave}$ divided by the first crosslation maximum $C_{max}$.

The ratio of the slope at origin $S_0$ and the first crosslation maximum $C_{max}$ is proportional to the bandwidth of observed interference. This ratio is used by the arithmetic/control unit ACU to detect whether or not the bandwidth of observed interference remains within an expected nominal range. When a relatively narrowband and strong interference is present, the frequency measurement process will be disrupted; this information is also available at output SIR of the unit ACU.

Figure 8:
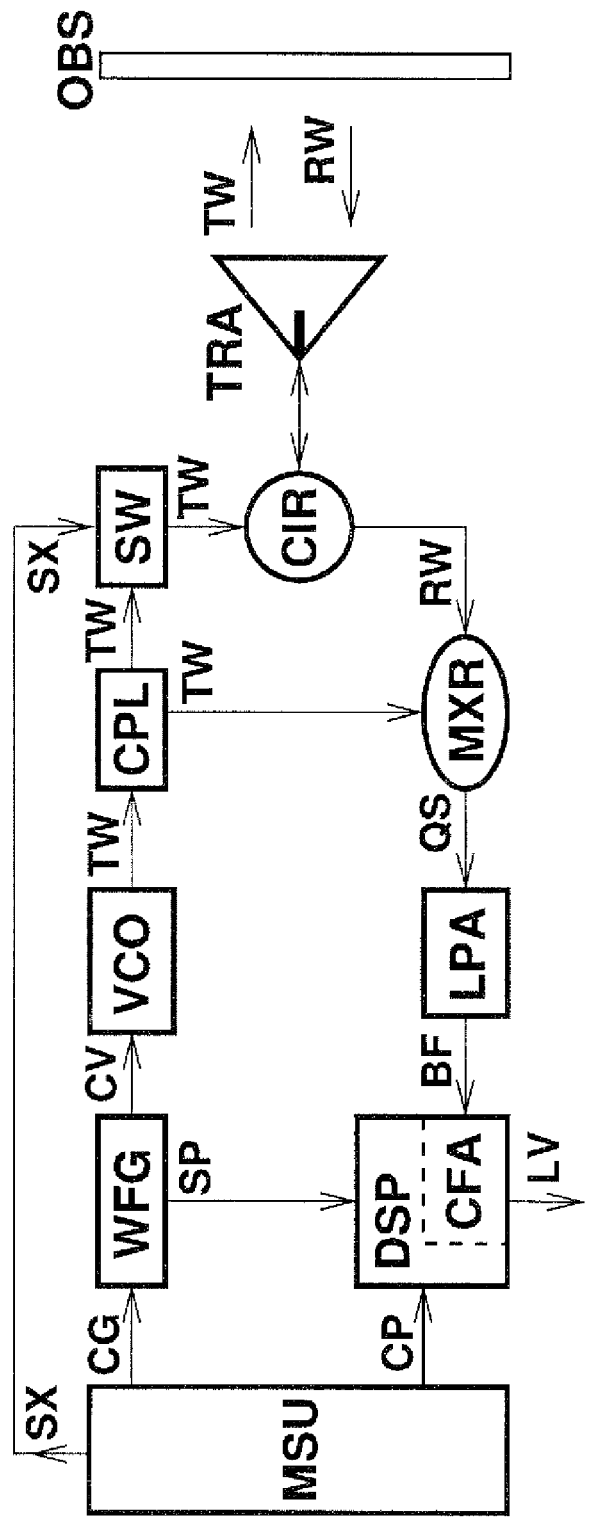
FIG. 8 is a simplified functional block diagram of conventional FMCW automotive radar that incorporates a crosslation-based frequency analyzer CFA constructed in accordance with the embodiment of the invention.

FIG. 8 is a simplified functional block diagram of a FMCW automotive radar system that utilizes a crosslation based frequency analyzer CFA constructed in accordance with the present embodiment. The frequency analyzer CFA described above is incorporated in a digital signal processor DSP to provide reliable beat-frequency measurements and improved resistance to multiuser interference. Additionally, the system comprises a mode select unit MSU and a switch SW.

In 'listen-only' operating mode, the mode select unit MSU blocks the signal transmission by applying a control signal SX to the switch SW. Accordingly, the crosslation-based frequency analyzer CFA processes interference alone to evaluate the level and the bandwidth of received radio noise. The unit MSU may also select a different reference signal TW (a potential ranging signal) by applying a suitable control signal CG to the waveform generator WFG. The digital signal processor DSP receives all relevant information from the unit MSU via input CP. If the type and level of multiuser and other interference are both acceptable, the radar operates in its standard regime.

The way in which crosslation function scanner CFS determines which crosslation function samples to discard in the present embodiment will now be described.

The shape of a crosslation function due to interference is assumed to be known from measurements made in 'listen-only' mode, or from the known frequency characteristics of the low-pass filter LPA following the mixer MXR. However, the level of interference cannot be known in the second case.

When a crosslation function has been determined for a beat signal corrupted by interference (that, in the non-listen-only mode), a first crosslation maximum is used as follows:

Its position in time will indicate whether or not the interference bandwidth is limited by the bandwidth of the low-pass filter (in this case, the maximum value of slope $S_0$ will be observed). It may also happen that relatively narrow-band interference has been observed and its effects need also to be somehow evaluated.

The value of the first crosslation maximum $C_{max}$ determines the level of interference. If there is no external interference, the first crosslation maximum will be produced by thermal noise alone, and it will exhibit a maximum value of slope at zero $S_0$, and a small value of the maximum $C_{max}$.

Having observed the value of $S_0$ and that of $C_{max}$, the system will 'plot' (that is, compute) the entire expected crosslation function due to interference alone to determine at which time $\tau_S$, the crosslation value would decrease to a level much smaller than that of a crosslation function due to a beat signal alone (observed at large values of $\tau$). In this embodiment, this process of plotting (computing) the expected crosslation function due to interference alone is performed by scaling the predetermined crosslation function shape (obtained in the listen-only mode or using the characteristics of the low-pass filter LPA) in accordance with the first crosslation maximum $C_{max}$ and slope $S_0$ as scaling factors. Accordingly, all samples from the time interval (0, $\tau_S$) will be excluded from any subsequent analysis. The present embodiment utilizes the crosslation samples from a time interval TM, starting from a first crosslation zero occurring somewhere at time $\tau > \tau_S$, and ending at a last observed crosslation zero, although this is not essential.

When the slope at zero is substantially smaller than the nominal maximum value of $S_0$ (determined by the bandwidth of the low-pass filter), and the maximum $C_{max}$ is large, the system may declare that reliable operation of automotive radar can no longer be guaranteed.

Modifications and Variations

Many modifications and variations can be made to the embodiment described above.

In the embodiment described above, the beat signal in the time period TM (that is the time period excluding the discarded crosslation function samples) is analyzed to calculate the beat frequency BF and signal-to-inference ratio SIR using a technique which employs the magnitudes of the crosslation samples in the time period TM and the slope at the position of each zero crossing in the time period TM. However, there are many different ways in which the beat signal in the time period TM may be analyzed to calculate its required properties. For example, a number of different techniques devised by the present inventor are described in EP-A-2 000 810 and WO-A-2008/149100.

It will be understood that the foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated.

The invention claimed is:

1. A frequency analyser, comprising:
   a crosslator operable to process an input signal containing a desired signal and interference to produce a sequence of discrete-time crosslation function values for the input signal;
   a peak detector operable to detect a crosslation function value having a local maximum in the sequence of crosslation function values;
   a slope detector operable to detect a slope of a line to the first value in the sequence of crosslation function values;
   a selector operable to determine crosslation function values to be discarded based upon the detected crosslation function value having the local maximum value and the detected slope; and
   a frequency calculator operable to process the crosslation function values, excluding the discarded values, to calculate a frequency value of the desired signal.

2. The frequency analyser of claim 1, further comprising a signal-level to interference-level calculator operable to process the crosslation function values, excluding the discarded values, to calculate a signal-level to interference-level ratio.

3. The frequency analyser of claim 1, wherein the crosslator is operable to process the input signal to produce the sequence of discrete-time crosslation function values in accordance with the crosslation function $C(\tau)$:

$$C(\tau) = \frac{1}{K}\sum_{k=1}^{K}(-1)^{\psi}s(t-t_k) = \frac{1}{K}\sum_{k=1}^{K}(-1)^{\psi}s_k(\tau)$$

where:
   $t_1, t_2, \ldots t_k, \ldots t_K$ are the time instants at which the input signal s(t) crosses a zero level such that $s(t_k)=0$;
   for a zero-crossing occurring at $t_k$, the signal trajectory $s_k(\tau)=s(t_k+\tau)$;
   $\tau$ is relative time such that each trajectory $s_k(\tau)$ is a time-shifted copy of the input signal s(t), with the time shift being given by $\tau=t-t_k$;
   $\{s(t_k+\tau); k=1, 2, \ldots K\}$ are mapped by the time shifts into another set of trajectories $\{s_k(\tau); k=1, 2, \ldots K\}$;
   $\psi=0$ for an upcrossing of the zero level
   $\psi=1$ for a downcrossing of the zero level.

4. The frequency analyser of claim 1, wherein the selector is operable to determine the crosslation function values to be discarded by using the crosslation function value having the local maximum value and the detected slope to compute a crosslation function due to interference and to determine a time at which the computed crosslation function due to interference decreases to a level smaller than the crosslation function of the desired signal.

5. The frequency analyser of claim 4, wherein the selector is operable to compute the crosslation function due to interference by scaling a predetermined crosslation function using the crosslation function having the local maximum value and the detected slope.

6. The frequency analyser of claim 1, wherein the crosslator comprises:
   a timing/control unit operable to set a time interval within which the crosslator is arranged to process the input signal; and an event detector arranged to receive the most recent sample of the input signal and the previous sample of the input signal as the input signal is evolving in real time, and to detect a zero crossing if the two consecutive samples have opposite signs, such that the crosslator is operable to determine the crosslation function values in real time.

7. A frequency-modulated continuous-wave radar system comprising:
a radar signal generator operable to generate and transmit a frequency-modulated continuous-wave radar signal;
a receiver operable to receive a reflected radar signal;
a beat signal generator operable to generate a beat signal from the generated and received radar signals; and
a frequency analyser according to claim 1 arranged to receive the beat signal as its input signal and calculate the frequency of the beat signal.

8. The radar system of claim 7, further comprising:
a controller operable to effect a listen mode in which transmission of the radar signal is blocked so that the receiver receives only interference, and the beat signal generator generates a beat signal from the generated radar signal and the received interference;
and wherein, in the listen mode, the system is arranged to calculate a crosslation function for the interference for subsequent use in determining which crosslation function values should be discarded.

9. The radar system of claim 7, further comprising:
a processor operable to determine if the level and bandwidth of the interference satisfy predetermined criteria and, if the predetermined criteria are not satisfied, to prevent the radar system transmitting the radar signal or to output a warning that reliable operation of the radar system can no longer be guaranteed.

10. A method of processing an input signal containing a desired signal and interference to perform frequency analysis, the method comprising a frequency analyser apparatus performing processes of:
performing a crosslation operation on the input signal to produce a sequence of discrete-time crosslation function values for the input signal;
detecting a crosslation function value having a local maximum in the sequence of crosslation function values;
detecting a slope of a line to the first value in the sequence of crosslation function values;
determining crosslation function values to be discarded based upon the detected crosslation function value having the local maximum value and the detected slope; and
processing the crosslation function values, excluding the discarded values, to calculate a frequency value of the desired signal.

11. The method of claim 10, wherein the crosslation operation is performed by the frequency analyser apparatus on the input signal to produce the sequence of discrete-time crosslation function values in accordance with the crosslation function $C(\tau)$:

$$C(\tau) = \frac{1}{K}\sum_{k=1}^{K}(-1)^{\psi}s(t-t_k) = \frac{1}{K}\sum_{k=1}^{K}(-1)^{\psi}s_k(\tau)$$

where:
$t_1, t_2, \ldots t_k, \ldots t_K$ are the time instants at which the input signal $s(t)$ crosses a zero level such that $s(t_k)=0$;
for a zero-crossing occurring at $t_k$, the signal trajectory $s_k(\tau)=s(t_k+\tau)$;
$\tau$ is relative time such that each trajectory $s_k(\tau)$ is a time-shifted copy of the input signal $s(t)$, with the time shift being given by $\tau=t-t_k$;
$\{s(t_k+\tau); k=1, 2, \ldots K\}$ are mapped by the time shifts into another set of trajectories $\{s_k(\tau); k=1, 2, \ldots K\}$;
$\psi=0$ for an upcrossing of the zero level
$\psi=1$ for a downcrossing of the zero level.

12. The method of claim 10, wherein the crosslation function values to be discarded are determined by the frequency analyser apparatus by using the crosslation function value having the local maximum value and the detected slope to compute a crosslation function due to interference and determining a time at which the computed crosslation function due to interference decreases to a level smaller than the crosslation function of the desired signal.

13. The method of claim 12, wherein the crosslation function due to interference is computed by the frequency analyser apparatus by scaling a predetermined crosslation function using the crosslation function having the local maximum value and the detected slope.

14. The method of claim 10, wherein the frequency analyser apparatus performs the crosslation operation by:
setting a time interval within which the input signal is to be processed;
receiving the most recent sample of the input signal and the previous sample of the input signal as the input signal evolves in real time; and
detecting a zero crossing if the two consecutive samples have opposite signs, such that the crosslation operation determines the crosslation function values in real time.

15. A method of operating a frequency-modulated continuous-wave radar system comprising:
generating and transmitting a frequency-modulated continuous-wave radar signal;
receiving a reflected radar signal;
generating a beat signal from the generated and received radar signals; and
processing the beat signal using a method according to claim 10 to calculate the frequency of the beat signal.

16. The method of claim 15, further comprising:
operating the radar system in a listen mode in which transmission of the radar signal is blocked so that only interference is received, and a beat signal is generated from the generated radar signal and the received interference;
and wherein, in the listen mode, the system calculates a crosslation function for the interference for subsequent use in determining which crosslation function values should be discarded.

17. The method of claim 15, further comprising:
determining if the level and bandwidth of the interference satisfy predetermined criteria and, if the predetermined criteria are not satisfied, preventing the radar system transmitting the radar signal or outputting a warning that reliable operation of the radar system can no longer be guaranteed.

* * * * *